United States Patent
Levinson et al.

(10) Patent No.: US 6,653,765 B1
(45) Date of Patent: Nov. 25, 2003

(54) UNIFORM ANGULAR LIGHT DISTRIBUTION FROM LEDS

(75) Inventors: Lionel M. Levinson, Niskayuna, NY (US); Steven J. Duclos, Clifton Park, NY (US); Alok M. Srivastava, Schenectady, NY (US); Anil R. Duggal, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/550,769

(22) Filed: Apr. 17, 2000

(51) Int. Cl.⁷ .................................................. H01J 1/62
(52) U.S. Cl. ..................... 313/112; 313/512; 313/113
(58) Field of Search ................................ 313/112, 506, 313/509, 503, 505, 489, 501, 110, 486, 108 D, 113; 362/293, 512, 84, 230; 257/99, 98

(56) References Cited

U.S. PATENT DOCUMENTS

| | | | |
|---|---|---|---|
| 3,875,456 A | 4/1975 | Kano et al. | |
| 4,152,624 A | 5/1979 | Knaebel | |
| 5,151,606 A | 9/1992 | Grieve | |
| 5,208,462 A | 5/1993 | O'Connor et al. | |
| 5,803,579 A | 9/1998 | Turnbull et al. | |
| 5,813,752 A | 9/1998 | Singer et al. | |
| 5,847,507 A | 12/1998 | Butterworth et al. | |
| 5,955,837 A | * 9/1999 | Horikx et al. | ............... 313/506 |
| 5,998,925 A | 12/1999 | Shimizu et al. | |
| 6,015,719 A | 1/2000 | Kish, Jr. et al. | |

* cited by examiner

Primary Examiner—Nimeshkumar D. Patel
Assistant Examiner—Ken A Berck
(74) Attorney, Agent, or Firm—Fay, Sharpe, Fagan, Minnich & McKee, LLP

(57) ABSTRACT

A light source (10) includes a light emitting component (32), such as a UV/blue light emitting diode or laser diode, a layer (46) of a light scattering material (42), and a layer (48) of a phosphor material (44). The phosphor material converts a portion of the light emitted by the light emitting component to light of a longer wavelength, such as yellow light. The scattering material scatters the light emitted by the light emitting component and/or the light converted by the phosphor to improve the overall uniformity of the angular distribution of the light. When combined, the converted and scattered light has a more uniform angular distribution, that is, it maintains the approximately the same color as the viewing angle is changed.

17 Claims, 5 Drawing Sheets

UNIFORM ANGULAR LIGHT DISTRIBUTION FROM LEDS

BACKGROUND OF THE INVENTION

This invention relates to light emitting devices comprising a light emitting diode or laser diode (LED), an excitable phosphor, and a scattering medium for providing uniform light illumination. It finds particular application in combination with a UV/Blue LED and a phosphor or blend of phosphors, for converting LED-generated ultraviolet (UV) and/or blue light into white light for general illumination purposes. It should be appreciated, however, that the invention is also applicable to the conversion of light from other LED sources to light of a different wavelength.

The advent of GaN-based epitaxial structures has lead to the development of UV and/or blue ("UV/blue") light emitting devices, including light emitting diodes and lasers (generally referred to herein as LEDs). By combination of the light emitting device with one or more phosphors, generation of visible light (e.g., red, blue, or white light) is achieved. The phosphor transforms a portion of the UV or blue light into light of longer wavelength, for example, by employing a UV/blue absorbing, yellow emitting phosphor, such as $Y_3Al_5O_{12}$-$Ce^{3+}$ (commonly referred to as YAG-Ce), obtainable from Nichia Chemical Company.

The YAG-Ce phosphor converts LED blue light into yellow light. This produces a white field with a color rendering index (CRI) of about 77 and a color temperature ranging from about 6000 K to 8000 K. For some applications, conversion of UV/blue light from an LED to visible light using phosphors may be more attractive than the direct application of visible LEDs. Such UV/blue LED phosphor devices, for example, offer the opportunity to encompass a wider color range, which is important for display as well as for illumination applications.

White LEDs, i.e., LEDs which employ a combination of a UV/blue LED with one or more phosphors to provide an approximate white color, suffer from one drawback. While the light which has been down-converted to yellow by the phosphor has a relatively uniform angular distribution, the blue, unconverted light is distributed in a non-Lambertian fashion. Thus, when the yellow light and blue light are combined to make white light, the light emitted is not a uniform white light over all forward angles (i.e., the light does not have a uniform emission strength when viewed at different angles).

While phosphors do have the effect of scattering both the unconverted and the converted light to some extent, phosphor materials also absorb light. Thus, it is not practical to use a phosphor material to provide Lambertian light distribution, since at the thickness which would be employed to provide an approximately uniform distribution, the absorbance of light by the phosphor would result in a substantial loss in the overall intensity of the light source.

The present invention provides a new and improved light source, which overcomes the above-referenced problems and others.

SUMMARY OF THE INVENTION

In an exemplary embodiment of the present invention, a light source is provided. The light source includes a light emitting component, which emits light, and a light scattering material, positioned to receive the light emitted by the light emitting component. The light scattering material scatters at least a first portion of the light, to improve an angular distribution of the light. A phosphor material is positioned to receive at least a second portion the light emitted by the light emitting component, the phosphor material converting the second portion of the light to light of a different wavelength.

In another exemplary embodiment of the present invention, a light source with improved angular light distribution is provided. The light source includes a light emitting component and a light scattering material, which receives light emitted by the light emitting component and scatters the light without appreciable absorption of the light. A phosphor material receives at least one of the light emitted by the light emitting component and the light scattered by the light scattering material. The phosphor material converts at least a portion of the received light to light of a different wavelength.

In another exemplary embodiment of the present invention, a method of producing light having a more uniform angular color distribution is provided. The method includes scattering light emitted by a light emitting component with a light scattering material to increase the uniformity of the angular distribution of the light; and converting at least a portion of the light emitted by the light emitting component to light of a different wavelength with a phosphor.

One advantage of the present invention is that UV/blue light is converted to white light with a relatively Lambertian distribution.

Another advantage of the present invention is that light is produced with a relatively uniform color over a wide range of viewing angles.

Still further advantages of the present invention will become apparent to those of ordinary skill in the art upon reading and understanding the following detailed description of the preferred embodiments.

DESCRIPTION OF THE PREFERRED EMBODIMENTS

Figure 1:
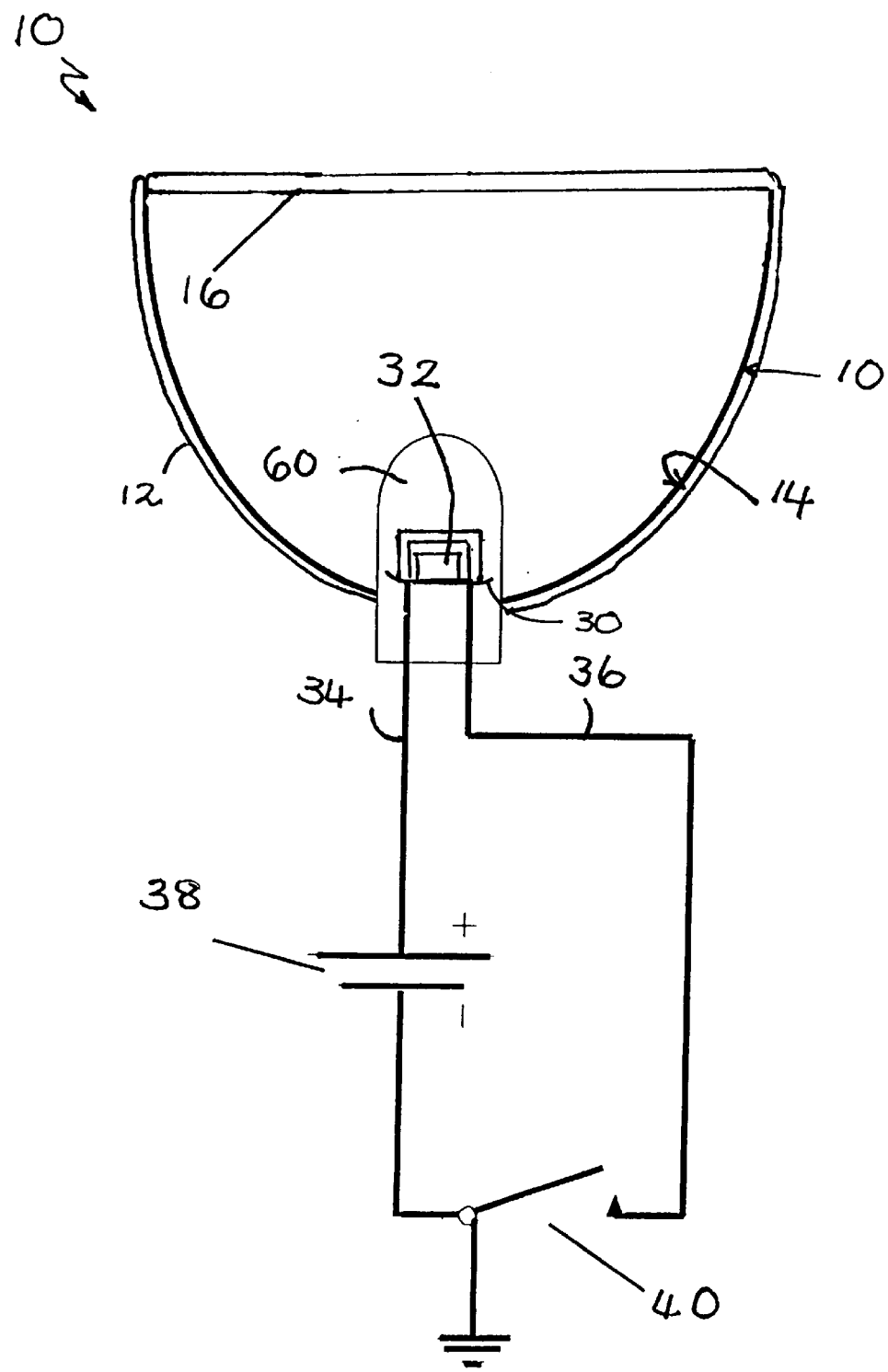
FIG. 1 is a schematic sectional view of a lamp employing the light scattering medium and phosphor of the present invention.

With reference to FIG. 1, a schematic view of a light source, such as a lamp 10, includes a cup-shaped reflector housing 12, which is coated on its interior surface with a reflective coating 14 capable of reflecting light in the UV and visible range of the electromagnetic spectrum. As used herein, the term "light" encompasses radiation in the UV and IR regions of the electromagnetic spectrum in addition to light in the visible region of the spectrum-i.e., all radiation emitted by or generated within the light source.

The reflector housing 12 may have a variety of configurations for reflecting light as a beam, or for providing more diffuse light. A light transmissive window 16 covers an open end of the housing. The window may be a lens, for focussing light emitted from the housing, or a sheet of light transmissive material, such as glass, plastic, or the like. Optionally, the window 16 or other portion of the device includes a UV filter which reflects unconverted UV light back into the reflector housing.

Figure 2:
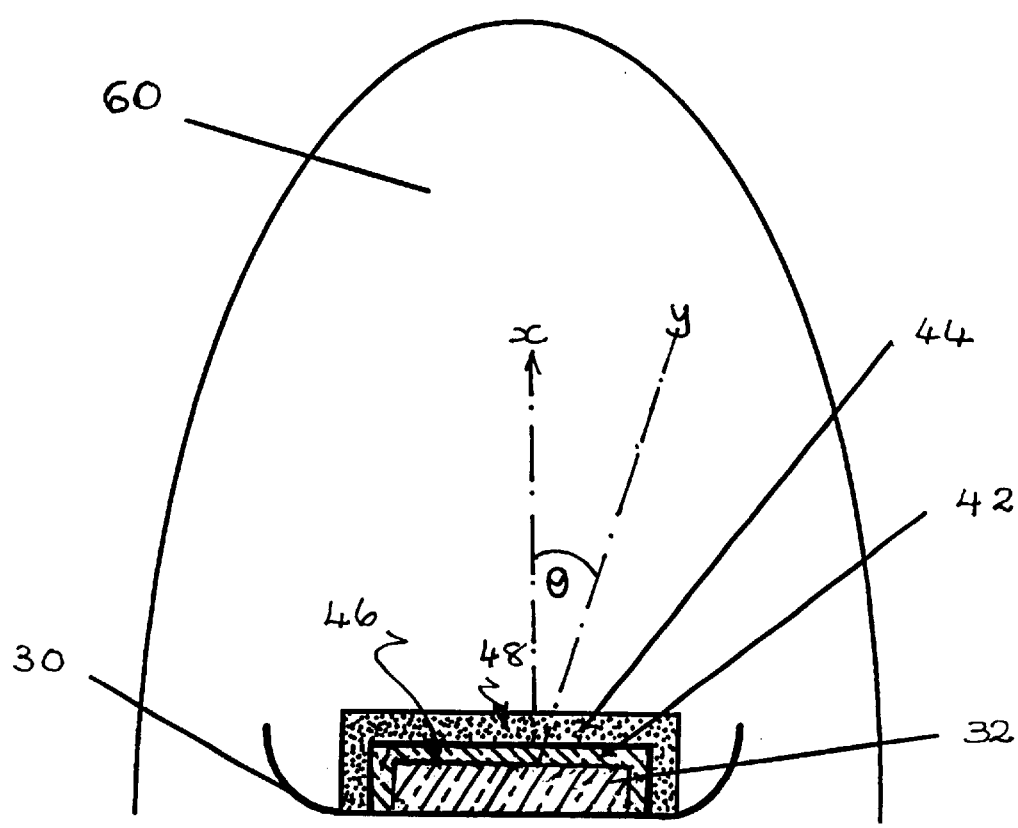
FIG. 2 is an enlarged schematic sectional view of the LED device of FIG. 1.

With reference also to FIG. 2, a reflective cup 30, capable of reflecting light in the UV and visible range of the electromagnetic spectrum, is positioned at the base of the housing 12. A light-emitting component 32, such as a light emitting diode or laser diode chip (referred to collectively as LEDs), or a bank of LEDs, is received within the cup, for example, with the base of the chip affixed to the cup. Electrical leads 34, 36 connect the light-emitting component 32 to a source of power 38, such as a battery, or other electrical power source. On application of a voltage (e.g., by operating a switch 40), light is emitted by the LED 32 into the housing and may be reflected from the reflective coating 14 and/or the cup 30.

The light emitted by the LED is non-uniform in its emission. Typically, light emission from the edge of the active layer of the LED chip is concentrated in a direction normal to the chip surface.

The light emitted by the LED impinges on a light scattering material 42. The light scattering material 42 scatters at least the blue portion of the light emitted by the LED and generally all of the light emitted by the LED, such that the light exiting the scattering material is distributed in a more Lambertian fashion, i.e., with an emission which is relatively even over a wide range of angles for a relatively uniform angular distribution. The light exiting the scattering material impinges on a phosphor material 44, which converts a portion of the emitted light from the LED 32 to a different wavelength, in the visible region of the spectrum. In the case of a blue/UV LED, the phosphor typically converts the light from the LED to a longer wavelength. While the light source will be described with particular reference to a blue/UV LED, it should be appreciated that LEDs emitting in different regions of the electromagnetic spectrum are also contemplated.

As shown in FIGS. 1 and 2, the light scattering material 42 is in the form of a layer 46, which coats the three sides of the LED through which light may be emitted. The phosphor material forms a second layer 48, on top of the light scattering layer, such that all light passing through the light scattering layer impinges on the phosphor material. In an alternative embodiment, shown in FIG. 3, the phosphor material 44 forms a coating or layer 50 on an interior surface 52 of the light transmissive window 16. The light scattering material 42 may surround the LED chip 32, as for FIGS. 1 and 2, or may be positioned elsewhere in the lamp, such as in the form of a coating or layer 54 on the underside of the phosphor layer, as shown in FIG. 4.

Other embodiments are also contemplated. For example, the positions of the phosphor material 44 and light scattering material 42 in FIGS. 1–4 may be reversed, such that the light strikes the phosphor material prior to impinging on the light scattering material. For example, in FIG. 2, layer 46 would be the phosphor material and layer 48, the light scattering material. Or, the two materials 42, 44 may be intermingled in a single layer. As long as at least the blue light emitted from the lamp 10 has impinged on the light scattering material 42 and a portion of the light emitted by the LED has been converted to light of a longer wavelength by the phosphor material 44, the relative positions of these materials 42, 44 can be varied.

It is preferable, however, for the light from the LED to be scattered by at least some of the scattering material before striking the phosphor material, as is the case in the embodiment of FIGS. 1 and 2. This is because the light emitted by the LED has a relatively narrow wavelength. It is therefore possible to select a scattering material, which is specific to the emission wavelength of the LED. If the light from the LED impinges on the phosphor material 44 before striking the scattering material 42, the range of wavelengths is increased and the scattering material, is less effective at scattering. In such cases, the scattering material preferably includes a variety of particle sizes and or geometries, which scatter the different wavelengths of light present.

Figure 4:
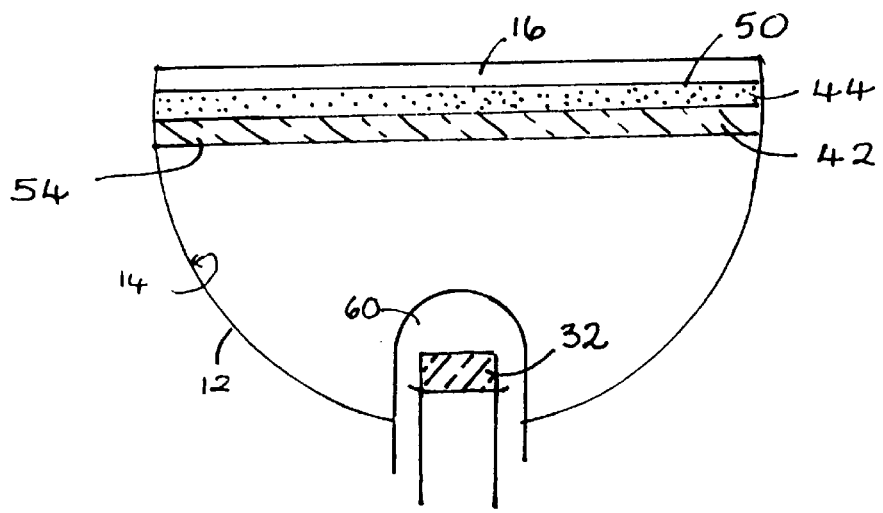
FIG. 4 is a schematic view of a second alternative embodiment of a lamp according to the present invention.

It is also preferable to have the light scattering material 42 and phosphor material close to the LED 32, as is the case in FIGS. 1 and 2, rather than away from the LED as shown in FIG. 4. This allows the lens system of the lamp to focus the light more effectively since the distance to the lens is greater.

The light scattering material is one which increases the unformity of the directionality of the light scattered by it. Preferably, the light scattering material causes the light to have a Lambertian or near Lambertian distribution, i.e., the radiance is the same, or nearly the same in all directions. Mathematically, this means that the light flux per solid angle is proportional to the cosine of the angle between the surface normal x and the direction of observation y (see FIG. 2). Such a scattering material reduces the non-uniform directionality of light emission from an LED chip. The light scattering material thus yields a light emission that has an emission strength that is relatively uniform in all directions. Such scattering reduces the spatial non-uniformities in intensity emission from the LED device. As a result, an observer sees the light as having the same color over a wide range of viewing angles θ.

The light scattering material reflects and/or refracts the light impinging upon it. To scatter light effectively, the light scattering material preferably has a high index of refraction, preferably greater than about 1.2, and more preferably, greater than about 1.46. The light scattering material is preferably also one which does not appreciably absorb the light.

Scattering efficiency is also influenced by particle size and particle shape. The particle size of the light scattering material is preferably on the order of the wavelength of the light to be scattered. For UV/blue light, a mean particle size of about 0.3 micrometers is thus preferred. Preferably, the mean particle size is less than about ten times the wavelength of light, i.e. for UV/blue light, the mean particle size is preferably less than about 3 micrometers. Preferably, the mean particle size is more than about one tenth the wavelength of light, i.e. for UV/blue light, the mean particle size is preferably more than about 0.03 micrometers. With regard to particle shape, particles with random and angular surfaces are preferred.

Suitable light scattering materials include fine particulate materials, such as glass, quartz, and oxides of Ti, Al, and rare earth elements, such as Gd and Y. Preferred materials are $TiO_2$ and $Al_2O_3$. An exemplary light scattering material is Dupont R960™ $TiO_2$. This material is a fine powder, having a mean particle size of 0.3 micrometers and comprises $TiO_2$ coated with an aluminosilicate glass. This material effectively scatters the wavelengths of light primarily emitted by a UV/blue GaN-based LED without appreciable absorption of the light.

The phosphor material 44 may include more than one phosphor, such as two or more different phosphors (fluorescent materials). When the phosphor material includes two or more different phosphors, these are preferably mixed together in the coating 48,50. Alternatively, the different phosphors are layered in the coating.

The phosphors that comprise the phosphor material 44 are substances which are capable of absorbing a part of the light emitted by the LED 32 and emitting light of a wavelength different from that of the absorbed light. Preferably, the phosphors convert a portion of the light to light in the visible region of the spectrum. In a UV/blue LED, the phosphor is used to convert a majority the UV portion of the light to useful light in the visible region of the spectrum, and may also convert a portion of the blue light to longer wavelengths. The light output from the lamp is thus a combination of two or more wavelengths, namely, unconverted blue light from the LED and light of at least one other color, such as yellow light, which has been converted by the phosphor(s). It is also contemplated that the light emitted by one or more phosphors is used to excite another phosphor(s).

The color of the light emitted by the lamp 10 is dependent on the selected mixture of phosphors in the phosphor mixture and on the emission spectrum of the LED 32. By selection of the type of LED used and the phosphor(s) in the phosphor material, light of a preselected color, such as white light, can be achieved. The visible light passes through the window 16 and/or is focussed by the lens.

Light emitting components 32 suited to use in the present invention include GaN-based (InAlGaN) semiconductor devices. Suitable GaN semiconductor materials for forming the light emitting components are generally represented by the general formula $In_iGa_jAl_kN$, where $0 \leq i$, $0 \leq j$, $0 \leq k$, and $i+j+k=1$. The nitride semiconductor materials may thus include materials such as InGaN and GaN, and may be doped with various impurities, for example, for improving the intensity or adjusting the color of the light emitted. Laser diodes are similarly formed from an arrangement of GaN layers. Techniques for forming LEDs and LDs are well known in the art.

GaN-based light emitting devices are capable of emitting light with high luminance. A suitable GaN-based LED device includes a substrate layer formed from a single crystal of, for example, sapphire, silicon carbide, or zinc oxide. A epitaxial buffer layer, of, for example, $n^+$GaN is located on the substrate, followed by a sequence of epitaxial layers comprising cladding layers and active layers. Electrical contact is made between two of the layers and corresponding voltage electrodes (through a metal contact layer) to connect the LED to the circuit and source of power.

The wavelength of the light emitted by an LED is dependent on the configuration of the semiconductor layers employed in forming the LED. As is known in the art, the composition of the semiconductor layers and the dopants employed can be selected so as to produce an LED with an emission spectrum which closely matches the excitation (absorption) spectrum of the phosphor material 42.

While the invention is described with particular reference to UV/blue light emitting components, it should be appreciated that light emitting components which emit light of a different region in the electromagnetic spectrum may also be used. For example, a red-emitting light emitting diodes or laser diode, such as an aluminum indium gallium phosphate (AlInGaP) LED emits light in the red region of the spectrum. Of importance is that the phosphor material used converts a portion of the light emitted by the LED to light of a different wavelength, leaving a portion of the light unconverted. At least the unconverted, non-Lambertian light impinges on the light scattering material so that the combined converted and unconverted light is emitted with a uniform angular distribution. More preferably, all of the light emitted by the LED is scattered by the scattering material 42.

The LED 32 is preferably protected by a resin mold 60, which may be formed from a clear epoxy, or other transparent encapsulation material, which transmits the light emitted from the light emitting components. Preferred epoxy encapsulation materials include UV/blue light resistant epoxies, such as cycloaliphatic epoxies. In the embodiment of FIGS. 1 and 2, the resin mold also encapsulates the light scattering material 42 and the phosphor material 44. This allows the resin material to act effectively as a lens, if desired, focussing the scattered and converted light.

Figure 3:
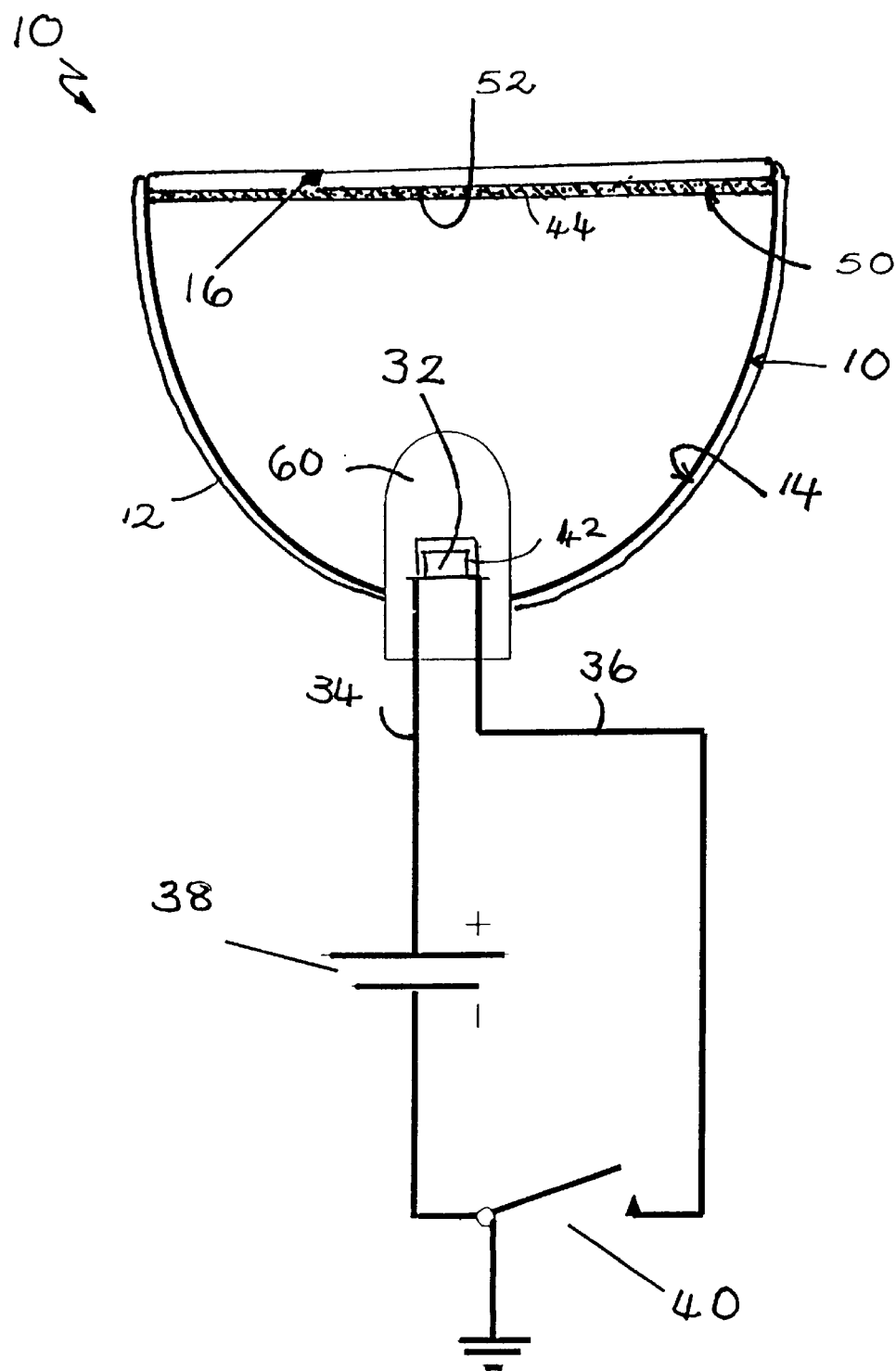
FIG. 3 is a schematic view of an alternative embodiment of a lamp according to the present invention.

In the embodiment of FIG. 3, the resin mold 60 encapsulates the light scattering material 42 but not the phosphor material 44, while in FIG. 4, the resin mold 60 encapsulates neither the light scattering material 42 nor the phosphor material 44. The resin mold may define a lens, which focuses the light.

In an alternative embodiment, a portion of, or all of the light scattering material 42 and/or the phosphor material 44 is mixed homogeneously with the encapsulation material to form the resin mold 60. In this embodiment, when the power supply is connected with the light emitting source 32, the UV/blue light emitted by the source 32 passes into the encapsulation material where it strikes the light scattering material and/or phosphor material and a portion is converted to visible light of longer wavelength.

Figure 5:
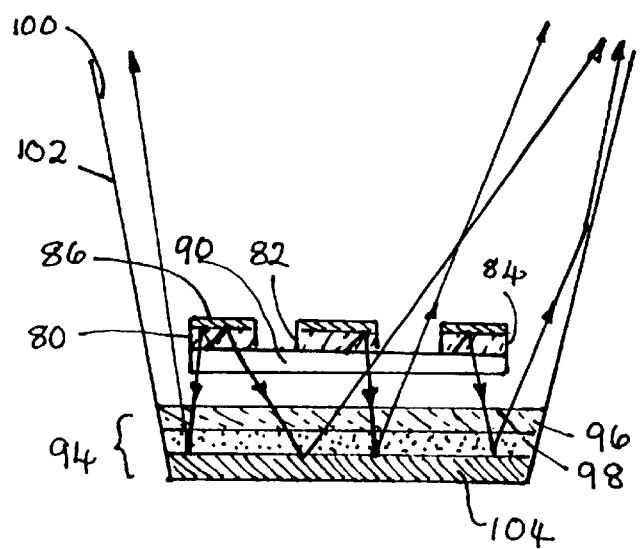
FIG. 5 is a schematic view of a third alternative embodiment of a lamp according to the present invention.

In another embodiment, shown in FIG. 5, the light from the LED may be transmitted from an LED 80 or bank of two or more LEDs 80, 82, 84 and reflected by a reflective layer 86 on an upper surface of the LED(s). The light passes through an LED substrate 90 onto a screen 94 coated with a layer 96 of the light scattering material 42 and a layer 98 of the phosphor material 44. FIG. 5 shows the screen 94 formed on a portion of the interior surface 100 of a housing 102, although other locations for the screen are also contemplated. The light emitted by the phosphor screen is then reflected by a reflective surface 104 on the interior surface of the housing, or another suitable reflective surface.

Other arrangements are also contemplated. For example, the phosphors may be arranged in different regions of the lamp and the light emitted from each region combined to form the resulting output.

The light scattering material can be any material which increases the angular distribution of the unconverted light (typically the blue light from a UV/blue LED) so that it approaches a more Lambertian distribution. As a result, the combined light, which includes the unconverted light and the light converted by the phosphor, has a relatively Lambertian distribution. This means that the color of the combined light does not change appreciably as the angle θ at which the light is viewed changes (see FIG. 2).

Figure 6:
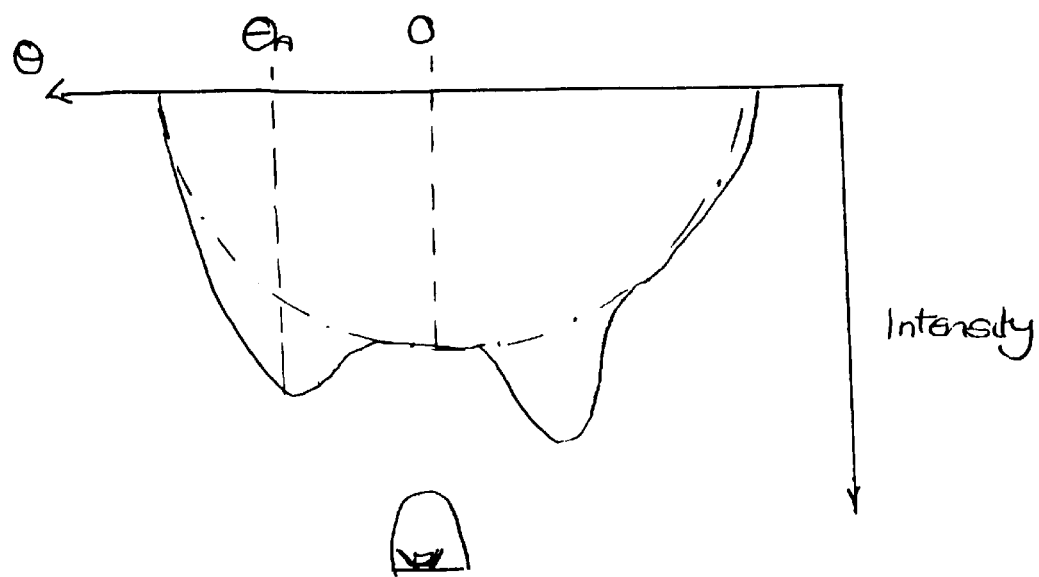
FIG. 6 is a schematic plot of intensity of unconverted (blue) and converted (yellow) light from a light source without the light scattering material.
Figure 7:
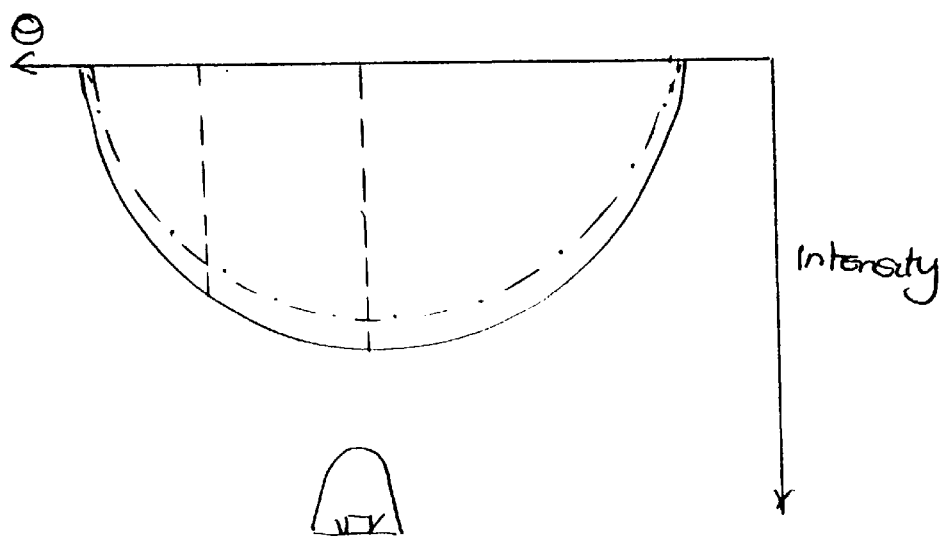
FIG. 7 is a schematic plot of intensity of unconverted (blue) and converted (yellow) light from a light source with the light scattering material.

By way of example, FIGS. 6 and 7 show schematically the variation in unconverted (blue) B and converted (yellow) Y light intensity with change in θ for a lamp with a UV/blue LED 32 and a yellow-emitting phosphor 44. FIG. 6 shows a plot of the intensity of blue and yellow light at varying angles θ from normal (θ=0) to the LED, without the light scattering material 42. FIG. 7 is the same, but with the light scattering material. As seen in FIG. 6, the color of the light changes with the viewing angle, with a peak in the unconverted, blue light from the LED occurring at $\theta_A$. Thus, when $\theta=\theta_A$, the emission is much bluer than when $\theta=0$. As seen in FIG. 7, the color of the combined blue and yellow light will remain relatively unchanged as the viewing angle $\theta$ changes, because the relative intensities of the blue and yellow light remain relatively constant.

It should be appreciated that FIGS. 6 and 7 are not intended to be exact representations of the light emitted by lamps with and without the scattering material but are intended to illustrate how the overall light color becomes more uniform in the presence of the scattering material.

The light scattering particles 42 in the light scattering layer 46 may be combined with other additives to form the layer. For example, the particles may be dispersed in a light-transmissive support material, such as an epoxy or other resin, i.e., similar to the material used to form the resin mold 60. To form such a layer, the light scattering material is preferably dispersed homogeneously in the support material, while the support material is in a liquid or viscous form, and the support material is then allowed to set on the chip 32, or elsewhere in the lamp, as desired. The light scattering layer 46,96, in this case, thus comprises the light scattering material 42 dispersed in the resin. An exemplary process includes combining about 30 parts of the light scattering material with about 70 parts of resin. At high particle concentrations, the material becomes difficult to manipulate.

In an alternative embodiment, the light scattering layer may be formed exclusively, or primarily from the light scattering material. For example, the light scattering material may be mixed with a binder, such as a liquid dispersant. Suitable liquid dispersants include conventional solvents (although in this case, the particles do not need to dissolve), such as water and low boiling organic compounds, such as alcohols. The mixture is then formed into the layer 46, either on the chip, or elsewhere in the lamp. When the binder is a conventional solvent, it may then be removed by evaporation or other removal process, leaving a layer of the light scattering material 42. Or, the binder may be left in the layer 46 after formation. Suitable binders to be left in the layer include silicones.

While dry compression is an alternative method of forming the scattering layer 46, it may be difficult to form a thin layer (less than about 5–10 particles in thickness) by this method. Additionally, the particles are left in intimate contact after compression. This provides less effective light scattering than when there is little or no contact between the particles, as is the case when the particles are dispersed in a resin or a binder.

The light scattering layer is preferably the equivalent of 1 to 10 particles in thickness. By "equivalent," it is meant that the layer may be thicker, depending on whether the particles in the layer are combined with another, substantially non-scattering material, such as a resin. For example, a layer of an equivalent of 10 particles in thickness and a particle size of 0.3 micrometers would be at least about 3 micrometers in thickness, and could be thicker, depending on the proportion of resin or other components in the layer. The light scattering layer in this case may be up to about 100 microns in thickness A variety of phosphors may be used in the present invention to form the phosphor material. In one embodiment, a UV/blue absorbing, yellow emitting phosphor is used, such as a cerium activated phosphor of a garnet-based fluorophors containing at least one element selected from the group consisting of Y, Lu, Sc, La, Gd, and Sm and at least one element selected from Al, Ga, and In. Examples of this type of phosphor include $Y_3Al_5O_{12}:Ce^{3+}$ (commonly referred to as YAG-Ce). Such phosphors are disclosed in U.S. Pat. No. 5,998,925. The yellow emitting phosphor is used to convert a portion of the light emitted by the LED to light in the yellow portion of the visible spectrum. The light emitted by the phosphor has a uniform angular light distribution.

In the description of phosphors, a conventional notation is used, wherein the chemical formula for a host or matrix compound is given first, followed by a colon and the formula for an activator (an impurity that activates the host crystal to luminesce). For example, in the case of a yellow YAG emitter, $Y_3Al_5O_{12}:Ce^{3+}$, $Y_3Al_5O_{12}$ is the host and $Ce^{3+}$ is the activator.

Examples of other phosphors which may be utilized in the phosphor material 44 include blue emitters, such as $BaMg_2Al_{16}O_{27}:Eu^{2+}$, or $(Ba, Sr, Ca)_5(PO_4)_3Cl:Eu^{2+}$ which convert a portion of the UV light to blue light; and red emitters, such as $Y_2O_3: Bi^{3+}, Eu^{2+}$, which convert a portion of the UV light to red light. Other suitable phosphors include $Y_2O_2S:Eu$ (a red emitter); and $ZnS:Cu, Ag$ (a green emitter).

In another embodiment, light from the one or more phosphors in the phosphor material is used to excite one or more additional phosphors.

Where more than one phosphor is used in the phosphor material 44, the phosphors may be mixed together in a single layer 48,98, or separately layered to form a multi-layer coating on the window 16 on the chip 32, or elsewhere in the lamp.

To form the phosphor layer 48,98, the phosphor or phosphors 44 used may be dispersed/blended in a dispersant, such as water, or other solvent. The resulting suspension is applied to a substrate, such as the layer of light scattering material 46 of FIG. 2, or the window 16 of FIG. 4, and dried to form the layer. Or, a leave in binder, such as a silicone, can be used.

Alternatively, the phosphor material may be combined in powdered or granular form with a support material in layer 48,98, analogously to the resin/light scattering material layer 46,96 described previously. In an alternative embodiment, some or all phosphor material is dispersed in the encapsulation material of the mold 60. The product of phosphor grain density and grain size is preferably high enough to ensure that most of the UV light is converted to visible light.

Phosphors to be used in a phosphor blend in light source 10 preferably have the following attributes:

1. Light resistance. Ideally, the phosphor is one which has a good resistance to light so that its fluorescent properties are not degraded when used over an extended period of time.
2. Capability of emitting light with a high efficiency.
3. Temperature resistance, if located in the vicinity of the LED.
4. Weatherability in the operating environment of the light source.

While the light source has been described in terms of a reflector housing, other arrangements which do not rely on a reflective surface are also contemplated. In one alternative embodiment, light emitted by the LED is transported by light pipes to the phosphor material and/or the light scattering material.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A light source comprising:
   a light emitting component which emits light in both the blue region and the UV region of the electromagnetic spectrum;
   a first layer comprising a phosphor material, the first layer being positioned to receive the light emitted by the light emitting component, the phosphor material converting light in the UV region to light of a different wavelength and leaving a portion of the blue light unconverted;
   a second layer comprising a light scattering material, positioned to receive light emitted by the light emitting component, such that all light from the light emitting component exiting the light source passes through both the first and second layers, the light scattering material scattering at least the unconverted blue portion of the light to improve an angular distribution of the unconverted blue portion of the light and provide a more uniform color distribution of the light source.

2. The light source of claim 1, wherein the light scattering material is a particulate material and the second layer is positioned intermediate the light emitting component and the first layer of the phosphor material, such that the light passes first through the light scattering material before passing through the phosphor material.

3. The light source of claim 1, wherein the light emitting component is selected from the group consisting of light emitting diodes and laser diodes.

4. The light source of claim 1, wherein the phosphor material includes a yellow emitting phosphor.

5. The light source of claim 1, wherein the light converted by the phosphor and the scattered second portion of the light are combined.

6. The light source of claim 1, wherein the light converted by the phosphor and the unconverted scattered light are combined to form white light.

7. A light source comprising:
   a light emitting component which emits light in both blue region and the UV region of the electromagnetic spectrum;
   a first layer comprising a light scattering material, positioned to receive light emitted by the light emitting component, the light scattering material scattering at least a portion of the blue light to improve an angular color distribution of the light, the light scattering material being a particulate material having a particle size of from about 0.03 microns to about 3 microns; and
   a second layer comprising a phosphor material positioned to receive the light emitted by the light emitting component and which has passed through the first layer, the phosphor material converting at least a portion of the UV light to light of a different wavelength.

8. The light source of claim 7, wherein the light scattering material includes a material selected from the group consisting of $TiO_2$, $Al_2O_3$, and combinations thereof.

9. The light source of claim 1, wherein:
   the light scattering material defines a first layer on the light emitting component; and
   the phosphor material defines a second layer on the first layer which receives light scattered by the light scattering material.

10. The light source of claim 1, further including:
    a housing, the light emitting component being positioned within the housing; and
    a window which closes the housing, at least one of the phosphor material and the light scattering material being deposited on the window.

11. The light source of claim 1, wherein at least a portion of at least one of the phosphor material and the light scattering material is dispersed in a medium which encapsulates the light emitting component.

12. The light source of claim 1, further including a housing, the light emitting component being positioned within the housing, at least one of the phosphor material and the light scattering material forming a layer on the housing.

13. A light source with improved angular light distribution comprising:
    a light emitting component which emits light of at least a first wavelength;
    a particulate light scattering material, which receives light emitted by the light emitting component and scatters the light of the first wavelength without appreciable absorption of the light;
    a phosphor material, which receives at least one of the light emitted by the light emitting component and the light scattered by the light scattering material, the phosphor material converting at least a portion of the received light to light of a different wavelength, at least a portion of the light of the first wavelength being unconverted by the phosphor material, wherein the light scattering material is in the form of a layer intermediate the light emitting component and the phosphor material.

14. The light source of claim 13, wherein the phosphor material is in the form of a layer adjacent the layer of light scattering material and receives light scattered by the light scattering material.

15. A method of producing light having a more uniform angular color distribution, the method comprising:
    (a) scattering blue light emitted by a light emitting component, which emits light in the UV and blue regions of the spectrum, with a particulate light scattering material to increase the uniformity of the angular distribution of the light; and
    (b) converting at least a portion of the UV light emitted by the light emitting component to light of a different wavelength with a phosphor.

16. The method of claim 15, wherein steps (a) and (b) are carried out sequentially.

17. The method of claim 15, further including: combining the scattered first portion of the light and the light of longer wavelength.

* * * * *